United States Patent [19]
Sato

[11] Patent Number: 5,504,018
[45] Date of Patent: Apr. 2, 1996

[54] PROCESS OF FABRICATING BIPOLAR TRANSISTOR HAVING EPITAXIALLY GROWN BASE LAYER WITHOUT DETERIORATION OF TRANSISTOR CHARACTERISTICS

[75] Inventor: Fumihiko Sato, Tokyo, Japan

[73] Assignee: NEC Corporation, Japan

[21] Appl. No.: 490,475

[22] Filed: Jun. 14, 1995

[30] Foreign Application Priority Data

Jun. 16, 1994 [JP] Japan .................................... 6-156450

[51] Int. Cl.⁶ .............................................. H01L 21/265
[52] U.S. Cl. ................................ 437/31; 437/89; 437/90; 437/131; 437/162; 148/DIG. 10; 148/DIG. 11; 148/DIG. 124; 257/587; 257/592; 257/593
[58] Field of Search ................................ 437/31, 89, 90, 437/162, 131; 148/DIG. 10, DIG. 11, DIG. 124; 257/587, 592, 593

[56] References Cited

U.S. PATENT DOCUMENTS

| | | | |
|---|---|---|---|
| 5,106,767 | 4/1992 | Comfort et al. | 437/31 |
| 5,140,400 | 8/1992 | Morishita | 357/34 |
| 5,217,909 | 6/1993 | Bertagnolli | 437/31 |
| 5,227,329 | 7/1993 | Kobayashi et al. | 437/101 |
| 5,296,391 | 3/1994 | Sato et al. | 437/31 |
| 5,321,301 | 6/1994 | Sato et al. | 257/592 |
| 5,323,032 | 6/1994 | Sato et al. | 257/198 |
| 5,323,057 | 6/1994 | Cook et al. | 257/591 |
| 5,424,228 | 6/1995 | Imai | 437/31 |
| 5,432,104 | 7/1995 | Sato | 427/31 |

FOREIGN PATENT DOCUMENTS 4-330730  11/1992  Japan .
6-168952   6/1994  Japan .

*Primary Examiner*—George Fourson
*Assistant Examiner*—Long Pham

[57] ABSTRACT

A bipolar transistor has a base rink structure epitaxially grown from an overhang portion of a poly-crystal silicon base electrode and an epitaxial collector layer and an intrinsic base structure grown on a concave central portion of the base rink structure after a diffusion stage of a dopant impurity into the base rink structure, and the intrinsic base structure is electrically connected through a buried collector region passing through the concave central portion into an epitaxial collector layer, thereby maintaining the dopant impurity profile in the intrinsic base structure without deterioration of transistor characteristics.

14 Claims, 11 Drawing Sheets

PROCESS OF FABRICATING BIPOLAR TRANSISTOR HAVING EPITAXIALLY GROWN BASE LAYER WITHOUT DETERIORATION OF TRANSISTOR CHARACTERISTICS

FIELD OF THE INVENTION

This invention relates to a process of fabricating a bipolar transistor and, more particularly, to a process of fabricating a bipolar transistor having an epitaxially grown base layer without deterioration of transistor characteristics.

DESCRIPTION OF THE RELATED ART

A thin base layer improves the high frequency characteristics of the bipolar transistor. The impurity concentration of the base layer is usually increased through an ion implantation, and the ion implantation brings the thin base layer several problems such as a channeling, uncontrollable impurity profile under low acceleration energy and crystal damages. If the base layer is thinner, these problems become more serious, and the ion implantation sets a limit on the thickness of the base layer.

In order to avoid the problems due to the ion implantation, it is proposed that a base layer is grown through an epitaxial process. The base layer is precisely controlled through the epitaxial growth, and optimizes the impurity concentration of the base layer. For this reason, various epitaxial processes have been proposed for the bipolar transistor.

FIG. 1 illustrates a prior art self-aligned bipolar transistor disclosed in Japanese Patent Publication of Unexamined Application No. 4-330730.

The prior art self-aligned bipolar transistor is fabricated on a p-type silicon substrate 1 having a resistivity ranging from 10 to 15 ohm-cm, and a plurality of n-type buried layer 2 heavily doped with arsenic atom are selectively grown on the p-type silicon substrate 1 at intervals. A lightly doped n-type epitaxial layer 3 is grown to 1.0 micron thick over the p-type silicon substrate 1 and the n-type buried layers 2, and the dopant concentration of the lightly doped n-type epitaxial layer 3 is of the order of $5 \times 10^{15}$ cm$^{-3}$. A field oxide layer 4 is selectively grown in the lightly doped n-type epitaxial layer 3 through a local oxidation of silicon technique, and penetrates into the p-type silicon substrate 1 so as to form a plurality of active areas in the lightly doped n-type epitaxial layer 3 in correspondence to the heavily doped n-type buried layers 2. However, only one active area corresponding to the heavily doped n-type buried layer 2 is illustrated in FIG. 1, and description is focused on this active area hereinbelow.

The active area is divided into two sub-areas by the field oxide layer 4. The lightly doped n-type epitaxial layer in the left sub-area serves as a collector region of the prior art self-aligned bipolar transistor, and the epitaxial layer in the right sub-area provides a collector contact 5 through a phosphorous doping stage.

The lightly doped n-type epitaxial layer 3 is partially covered with a silicon nitride layer 6, and two openings 6a and 6b are formed in the silicon nitride layer 6 over the left sub-area and the right sub-area, respectively. A thin silicon oxide layer may be provided between the n-type epitaxial layer 3 and the silicon nitride layer 6.

A heavily doped p-type base layer 7 is epitaxially grown on the lightly doped n-type epitaxial layer 3 exposed to the opening 6a, and fills a lower portion of the opening 6a.

A base electrode 8a of doped poly-crystalline silicon and a collector electrode 8b of doped poly-crystalline silicon are formed on the silicon nitride layer 6. The base electrode 8a projects into a space over the opening 6a, and a heavily doped p-type poly-crystalline silicon ring 9 is formed between a lower surface of the overhang portion of the base electrode 8a and the periphery of the heavily doped p-type base layer 7. The collector electrode 8b is held in contact with the heavily doped n-type collector contact region 5.

The base electrode 8a and the collector electrode 8b on the silicon nitride layer 6 are covered with a silicon oxide layer 10, and openings 10a and 10b are formed in the silicon oxide layer 10. The openings 10a is nested with the opening 6a, and the opening 10b exposes the collector electrode 8b.

A side wall 11 of silicon oxide is formed in the opening 10a, and covers the inner wall of the heavily doped p-type poly-crystalline silicon ring 9 and the lower and inner walls of the silicon oxide layer 10. An emitter region 12 of n-type single crystalline silicon is formed in an opening defined by the side wall 11, and aluminum wirings 13a, 13b and 13c are held in contact with the base electrode 8a, the n-type emitter region 12 and the collector electrode 8b, respectively.

The epitaxially grown base layer 7 of the prior art bipolar transistor is not only thinner than a base layer formed through an ion implantation but also rather precise in dopant profile than the ion implanted base layer.

However, the p-type poly-crystalline silicon ring 9 is indispensable for the prior art bipolar transistor shown in FIG. 1, because the p-type base region 7 is spaced from the base electrode 8a. The dopant concentration of the p-type poly-crystalline silicon ring 9 is increased through a thermal diffusion from the p-type base layer 7, and the thermal diffusion stage destroys the dopant profile of the p-type base layer 7 and the p-n junction between the n-type epitaxial layer 3 and the p-type base layer 7.

The present inventor proposed a solution in Japanese Patent Application No. 4-341421. Japanese Patent Application No. 4-341421 was published on Jun. 14, 1994, and Japanese Patent Publication of Unexamined Application No. 6-168952 is assigned thereto. FIG. 2 illustrates the prior art bipolar transistor disclosed in Japanese Patent Publication of Unexamined Application No. 6-168952.

Description is focused on difference from the first prior art bipolar transistor shown in FIG. 1, and layers and regions corresponding to those of the first prior art bipolar transistor are labeled with the same references without detailed description.

According to the Japanese Patent Publication of Unexamined Application, a heavily doped p-type poly-crystalline silicon ring 21 and a heavily doped p-type single crystalline silicon layer 22 are formed between the overhang portion of the base electrode 8a and a periphery of the n-type epitaxial layer 3, and, thereafter, a central portion of the heavily doped p-type single crystalline silicon layer 22 is etched away so as to expose the n-type epitaxial silicon layer 3. Subsequently, p-type single crystalline silicon is epitaxially grown on the exposed surface of the n-type epitaxial layer 3, and forms an intrinsic p-type base layer 23.

The heavily doped p-type poly-crystalline silicon ring 21 and the heavily doped single crystalline silicon ring 22 are formed in the opening 6a before the intrinsic p-type base layer 23, and, accordingly, the dopant concentration of these rings 21 and 22 are optimized by diffusing the p-type impurity from the base electrode 8a without an influence on the dopant profile of the intrinsic base layer 23.

Thus, the second prior art is free from the problem inherent in the first prior art. However, the second prior art encounters following problems. First, the etching work does not correctly shape the heavily doped p-type single crystalline silicon layer 22 into an expected configuration, and the transistor characteristics are dispersed due to the differently shaped p-type single crystalline silicon layer 22.

If silicon-germanium is used for the base layer 23, the heterojunction between the base and the collector improves the transistor characteristics. However, etching residue produced from the p-type single crystalline silicon layer forms undesirable parasitic heterojunction, and the etching work results in a serious problem.

Finally, the etching work tends to damage the crystal of the n-type epitaxial layer 3, and the crystal damages do not allow the p-type base layer 23 to be perfectly grown thereon. This results in a large amount of leakage current, and the transistor characteristics are deteriorated. Although the crystal damage is removed by using an oxidation followed by a wet etching, this solution destroys the impurity profile at the boundary between the epitaxial silicon and the oxide film.

SUMMARY OF THE INVENTION

It is therefore an important object of the present invention to provide a process of fabricating a bipolar transistor which is free from the problems inherent in the first and second prior art bipolar transistors.

In accordance with the present invention, there is provided a process of fabricating a bipolar transistor, comprising the steps of: preparing a base structure having a first semiconductor layer of a first conductivity type and a first insulating layer of a first insulating material covering the first semiconductor layer; depositing a second semiconductor layer of a second conductivity type opposite to the first conductivity type on the first insulating layer; forming a first opening in the second semiconductor layer exposing a part of the first insulating layer; covering an upper surface of the second semiconductor layer and an inner wall of the second semiconductor layer defining the first opening with a second insulating layer of a second insulting material; etching the first insulating layer by using an etchant having a selectivity between the first insulating material and the second insulating material so as to form a second opening exposing a part of the first semiconductor layer, the second opening being wider than the first opening so that the second semiconductor layer has an overhang portion exposing a lower surface thereof to the second opening; epitaxially growing a third semiconductor layer from the lower surface of the second semiconductor layer and the part of the first semiconductor layer until a space below the overhang portion is filled with a peripheral portion of the third semiconductor layer, the peripheral portion of the third semiconductor layer being thicker than a central portion of the third semiconductor layer below the first opening; diffusing a dopant impurity of the second conductivity type from the second semiconductor layer into the peripheral portion so as to form a base rink substructure; growing a fourth semiconductor layer of the second conductivity type from the third semiconductor layer so as to form an intrinsic base structure; and forming an emitter region of the first conductivity type on the fourth semiconductor layer.

BRIEF DESCRIPTION OF THE DRAWINGS

The features and advantages of the process of fabricating a bipolar transistor according to the present invention will be more clearly understood from the following description taken in conjunction with the accompanying drawings in which.

DESCRIPTION OF THE PREFERRED EMBODIMENTS

First Embodiment

Figure 1:
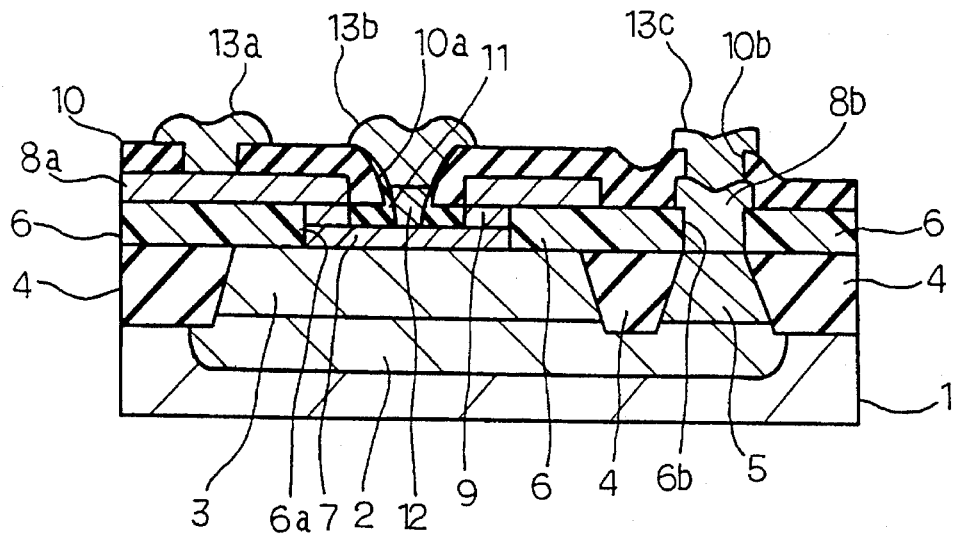
FIG. 1 is a cross sectional view showing the structure of the first bipolar transistor.
Figure 2:
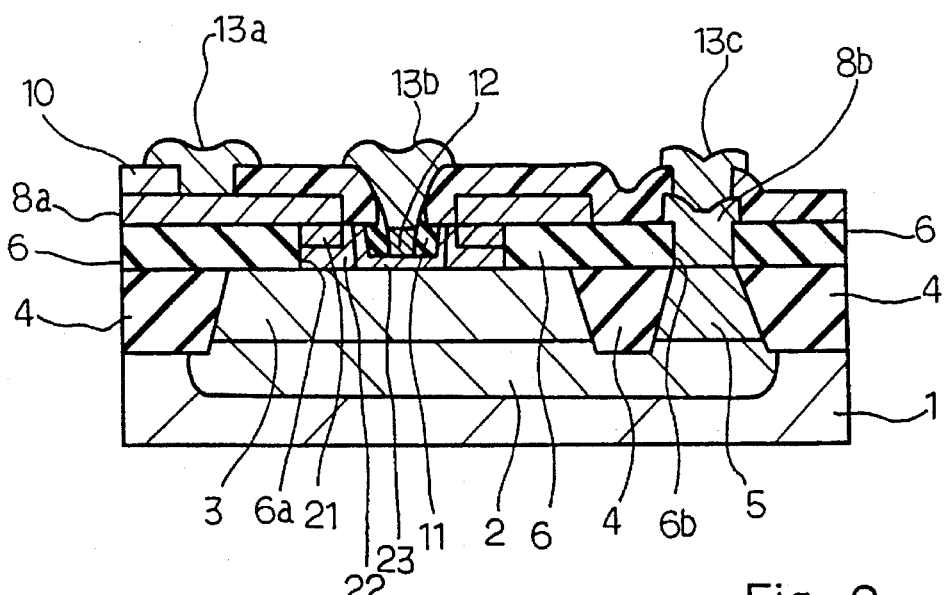
FIG. 2 is a cross sectional view showing the structure of the second bipolar transistor.
Figure 3:
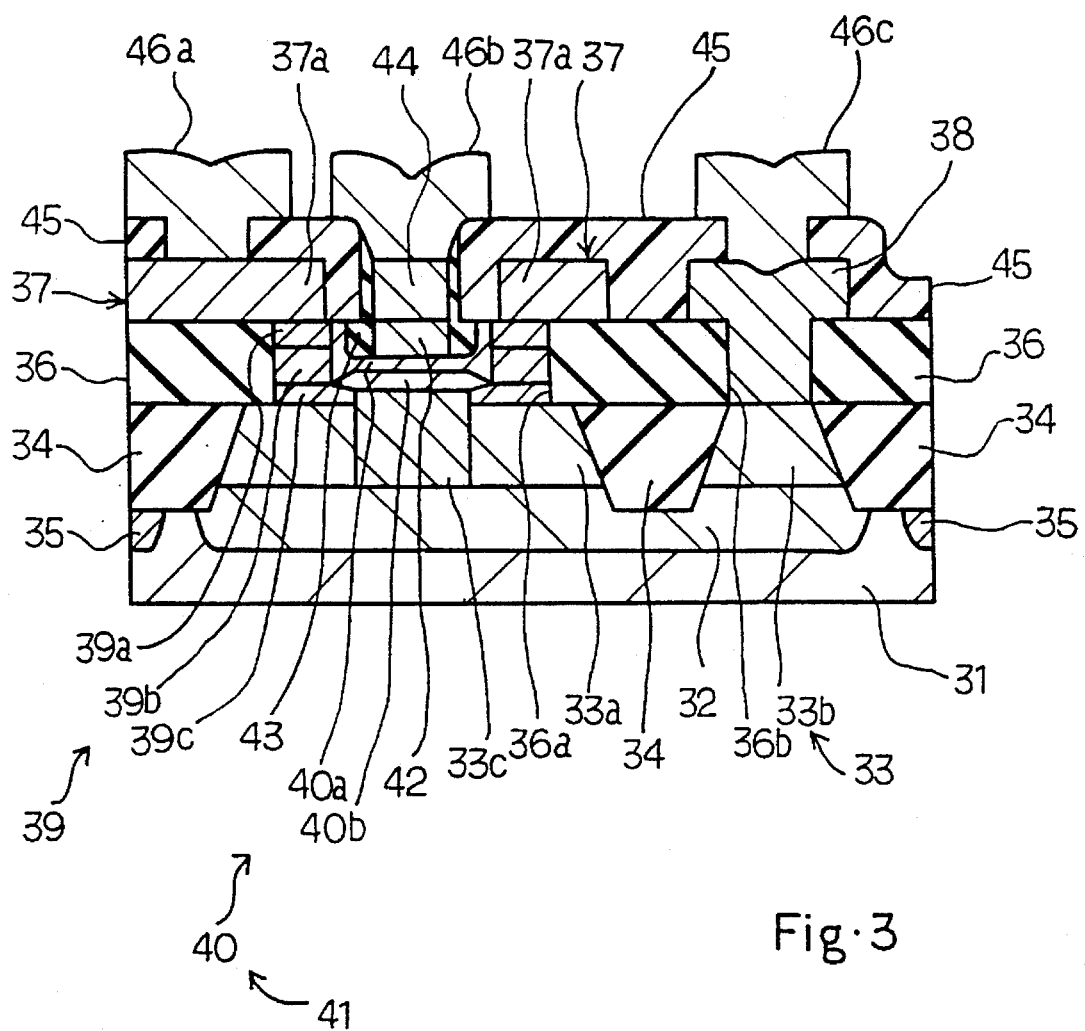
FIG. 3 is a cross sectional view showing the structure of a bipolar transistor according to the present invention.

Referring to FIG. 3 of the drawings, a bipolar transistor embodying the present invention is fabricated on a lightly doped p-type silicon substrate 31. The p-type silicon substrate 31 has (100) orientation, and is 10 to 20 ohm-cm in resistivity. On the surface portion of the p-type silicon substrate 31 is formed a heavily doped n-type buried layer 32 which is doped with arsenic atom or antimony. A lightly doped n-type epitaxial layer 33 is grown on the surface of the lightly doped p-type silicon substrate 31 to thickness of 0.7 micron, and is doped with phosphorus atom at $5 \times 10^{16}$ $cm^{-3}$. A thick field oxide layer 34 penetrates through the lightly doped n-type epitaxial layer 33 into the lightly doped p-type silicon substrate 31, and a heavily doped p-type channel stopper 35 is provided beneath the thick field oxide layer 34. In this instance, the thick field oxide layer 34 is of the order of 8000 angstroms thick. The thick field oxide layer 34 over the channel stopper 35 defines an area assigned to the bipolar transistor, and a part of the thick field oxide layer 34 reaches the heavily doped n-type buried layer 32. As a result, the lightly doped epitaxial layer 33 is split into a left portion serving as a collector region 33a and a right portion serving as a collector contact region 33b heavily doped with phosphorus atom.

A silicon oxide layer 36 covers the lightly doped n-type epitaxial layer 33 and the thick field oxide layer 34, and a base opening 36a and a collector contact opening 36b are formed in the silicon oxide layer 36. The base opening 36a and the collector contact opening 36b have respective edges oriented to <110>direction, and expose the collector region 33a and the collector contact region 33b, respectively.

A base electrode 37 of poly-crystalline silicon is patterned on the silicon oxide layer 36, and is doped with boron atom at $2 \times 10^{20}$ $cm^{-3}$. The base electrode 37 is about 2500 angstroms in thickness, and penetrates into a space over a periphery of the base opening 36a. A part of the base electrode occupying the space is hereinbelow referred to as "overhang portion 37a".

The collector contact opening 36b is filled with a collector electrode 38 of poly-crystalline silicon doped with phosphorus atom at $1 \times 10^{20}$ $cm^{-3}$, and is about 2000 angstroms in thickness.

A base rink sub-structure 39 is formed in a periphery of the base opening 36a under the overhang portion 37a, and a heavily doped poly-crystalline silicon ring 39a, a heavily doped single crystalline silicon ring 39b and a lightly doped single crystalline silicon ring 39c as a whole constitute the base rink sub-structure 39.

An intrinsic base sub-structure 40 is formed inside of the base rink sub-structure 39 in the base opening 36a, and a heavily doped p-type silicon-germanium layer 40a and a lightly doped p-type silicon-germanium layer 40b form in combination the intrinsic base sub-structure 40. The base rink sub-structure 39 and the intrinsic base sub-structure 40 as a whole constitute a base structure 41. In this instance, the silicon-germanium has a composition expressed as $Si_{0.9}Ge_{0.1}$.

The lightly doped p-type silicon-germanium layer 40b is held in contact with a buried collector region 33c. The buried collector region 33c vertically extends through the lightly doped p-type single crystalline silicon ring 39c and the lightly doped n-type epitaxial layer 33, and reaches the heavily doped n-type buried layer 32. Thus, the intrinsic base sub-structure 40 forms the p-n junction with the buried collector region 41 over the lightly doped n-type epitaxial layer 33.

A heavily doped n-type emitter region 42 is provided on the intrinsic base sub-structure 40, and the bottom surface of the heavily doped n-type emitter region is held in contact with the upper surface of the heavily doped p-type silicon-germanium layer 40a. A side insulating wall 43 is provided between the side wall of the heavily doped n-type emitter region 42 and the heavily doped p-type silicon-germanium layer 40a, and prevents the heavily doped n-type emitter region 42 from a direct carrier-path to the base rink sub-structure 39.

The heavily doped n-type emitter region 42 is held in contact with an emitter electrode 44 of doped poly-crystalline silicon, and the base electrode 37 and the collector electrode 38 are covered with a silicon nitride layer 45. Contact holes are formed in the silicon nitride layer 45 in such a manner as to expose the base electrode 37 and the collector electrode 38, and a base wiring 46a, an emitter wiring 46b and a collector wiring 46c are connected to the base electrode 37, the emitter electrode 44 and the collector electrode 38, respectively.

Description is hereinbelow made on a process of fabricating the bipolar transistor according to the present invention. The process sequence starts with preparation of the lightly doped p-type silicon substrate 31. The orientation and the resistivity are (100) and 10 to 20 ohm-cm as described hereinbefore.

First, the lightly doped p-type silicon substrate 31 is thermally oxidized for forming a silicon dioxide layer (not shown) of 5000 angstroms thick. The silicon dioxide layer may be deposited over the entire surface of the lightly doped p-type silicon substrate 31.

An appropriate photo-resist mask (not shown) is provided on the silicon dioxide layer through lithographic techniques, and the silicon dioxide layer is partially etched away so as to expose a part of the lightly doped p-type silicon substrate 31. The etching may be partially carried out by using a reactive ion etching technique for the upper 4000 angstroms and a wet etching for the remaining 1000 angstroms. An etchant in hydrofluoric acid system may be used for the wet etching.

The photo-resist mask is stripped off, and arsenic atom is ion implanted into the exposed area of the lightly doped p-type silicon substrate 31 at dose of $5\times10^{15}$ $cm^{-2}$ under acceleration energy of 70 keV. The lightly doped p-type silicon substrate 31 is placed in nitrogen atmosphere, and is annealed at 1100 degrees in centigrade for four hours. Then, the implanted arsenic atoms is driven into the lightly doped p-type silicon substrate 31, and forms the heavily doped n-type buried layer 32 of 2 microns thick. The silicon dioxide layer is etched away in the hydrofluoric acid containing etchant.

An appropriate photo-resist mask (not shown) is provided on the lightly doped p-type silicon substrate 31, and exposes an area of the lightly doped p-type silicon substrate 31 for the heavily doped p-type channel stopper 35. Boron atom is ion implanted into the exposed area of the lightly doped p-type silicon substrate 31 at dose of $1\times10^{13}$ $cm^{-2}$ under acceleration energy of 100 keV. The implanted boron atom forms the heavily doped p-type channel stopper 35. After the removal of the photo-resist mask, the lightly doped p-type silicon substrate 31 is annealed in the nitrogen atmosphere at 1000 degrees in centigrade for 30 minutes so as to cure crystal damages due to the ion implantation.

Subsequently, single crystalline silicon is epitaxially grown to 0.7 micron on the lightly doped p-type silicon substrate 31, and phosphorus atom is doped into the epitaxial silicon at $1\times10^{16}$ $cm^{-3}$. Thus, the lightly doped p-type silicon substrate 31 is overlain by the lightly doped n-type epitaxial silicon layer 33.

A surface portion of the lightly doped n-type epitaxial silicon layer 33 is oxidized, and a silicon oxide layer of 500 angstroms thick (not shown) covers the lightly doped n-type epitaxial silicon layer 33. Thereafter, silicon nitride (not shown) is deposited over the silicon oxide layer to 1000 angstroms thick through a low pressure chemical vapor deposition. An appropriate photo-resist mask (not shown) is provided on the silicon nitride layer, and exposes an area of the silicon nitride layer over the thick field oxide layer 34. An anisotropical etching such as a dry etching technique removes the exposed area of the silicon nitride layer, the silicon oxide layer beneath the exposed area and the lightly doped n-type epitaxial silicon layer 33 thereunder, and a moat of 3500 angstroms in depth is formed in the lightly doped n-type epitaxial silicon layer 33. The photo-resist mask is stripped off, and the exposed epitaxial silicon layer is thermally oxidized so as to form the thick field oxide layer 34 of 8000 angstroms in thickness. The part of the thick field oxide layer 34 splits the lightly doped n-type epitaxial silicon layer 33 into the collector region 33a and the collector contact forming region.

The lightly doped p-type silicon substrate 31 is dipped in hot phosphoric acid, and the silicon nitride layer is etched away.

The silicon oxide layer 36 is deposited to 1300 angstroms thick over the entire surface of the structure through a chemical vapor deposition technique. The silicon oxide layer 36 may be formed through a thermal oxidation. In this instance, when the silicon oxide layer 36 is deposited over the lightly doped n-type epitaxial silicon 33 and the thick field oxide layer 36, a base structure is obtained.

An appropriate photo-resist mask (not shown) is provided through the lithographic techniques, and exposes an area of the silicon oxide layer 36 over the collector contact forming region. The silicon oxide layer 36 is partially etched away in the hydrofluoric acid containing etchant for forming the collector contact opening 36b. Phosphorus atom is ion implanted into the collector contact forming region at dose of $5\times10^{15}$ $cm^{-2}$ under acceleration energy of 70 keV. After the removal of the photo-resist mask, the epitaxial silicon layer 33 is annealed at 900 degrees in centigrade for 30 minutes so as to recover the collector contact forming region from the crystal damages due to the ion implantation, and the collector contact region 33b is formed under the collector contact opening 36b.

An oxide (not shown) is removed from the surface of the collector contact region 33b, and non-doped poly-crystalline silicon is deposited to 2500 angstroms thick over the entire surface of the structure by using a low pressure chemical vapor deposition. The non-doped poly-crystalline silicon layer covers the upper surface of the silicon oxide layer 36, and is held in contact with the exposed collector contact region 33b.

An appropriate photo-resist mask (not shown) is provided on the non-doped poly-crystalline silicon layer through the lithographic techniques, and exposes an area of the non-doped poly-crystalline silicon layer over the collector contact opening 36b. Phosphorus atom is ion implanted into the exposed area of the non-doped poly-crystalline silicon layer at dose of $5 \times 10^{15}$ cm$^{-2}$ under acceleration energy of 70 keV, and the photo-resist mask is, thereafter, removed.

Another photo-resist mask (not shown) is provided on the non-doped poly-crystalline silicon layer, and exposes an area of the non-doped poly-crystalline silicon layer assigned to the base electrode 37. Boron atom is ion implanted into the exposed area at dose of $5 \times 10^{15}$ cm$^{-2}$ to $1 \times 10^{16}$ cm$^{-2}$ under acceleration energy of 20 keV. After the ion implantation, the photo-resist mask is removed.

The non-doped poly-crystalline silicon partially doped with the phosphorus and the boron is patterned by using the lithographic techniques and an anisotropic dry etching, and the base electrode 37 and the collector electrode 38 are formed on the silicon oxide layer 36 and the collector contact region 33b, respectively.

Silicon nitride is deposited to 1500 angstroms thick over the entire surface of the structure by using the low pressure chemical vapor deposition, and a silicon nitride layer (not shown) covers the base electrode 37, the collector electrode 38 and an exposed area of the silicon oxide layer 36. An appropriate photo-resist mask (not shown) is provided on the silicon nitride layer by using the lithographic techniques, and exposes an area of the silicon nitride layer over the intrinsic base sub-structure 40 and the emitter region 42. The exposed area of the silicon nitride layer and a part of the base electrode 37 beneath it are etched away by using the anisotropical dry etching, and an opening 37a is formed in the base electrode 37.

The photo-resist is stripped off, and silicon nitride is further deposited to 1200 angstroms thick over the entire surface by using the low pressure chemical vapor deposition. Since the silicon nitride has been deposited on the base electrode 37, the silicon nitride layer on the base electrode becomes thicker than the silicon nitride layer on the inner wall of the base electrode 37 and the exposed area of the silicon oxide layer 36.

The silicon nitride layer is uniformly etched away by using the anisotropical etching technique until the silicon nitride layer 45 of 1200 angstroms thick is left on the base electrode 37, the collector electrode 38 and the silicon oxide layer 36 outside of the base electrode 37. Although the silicon nitride layer is removed from the exposed silicon oxide layer 36 in the opening 37b, a part 5a of the silicon nitride layer is left on the inner wall defining the opening 37b.

Figure 4A:
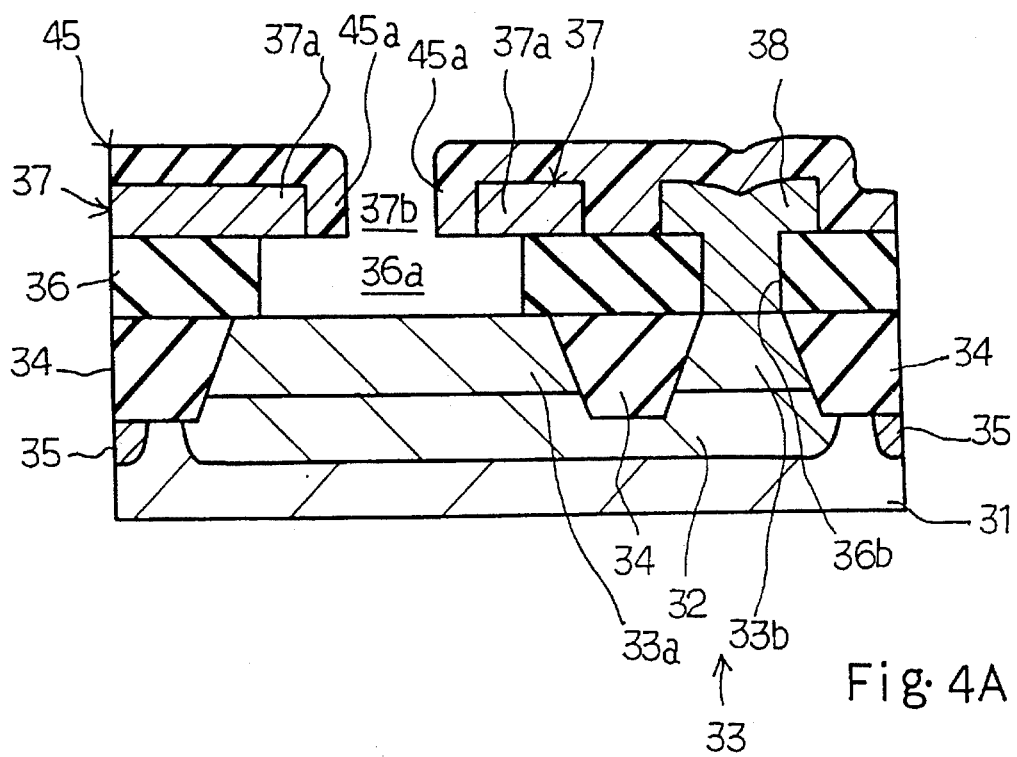
FIGS. 4A to 4F are cross sectional views showing a process sequence for fabricating the bipolar transistor according to the present invention.

The resultant structure is dipped into the hydrofluoric acid containing etchant so as to remove the exposed silicon oxide layer 36. The etching proceeds from the surface exposed to the opening 37b toward the lightly doped n-type epitaxial layer 33, then the hollow space laterally extends for forming the base opening 36a as shown in FIG. 4A. The overhang portion 37a is exposed to the base opening 36a by 1500 angstroms in length. It is preferable for the overhang portion 37a to have the projecting length not less than the thickness of the intrinsic base sub-structure 40. Moreover, it is recommendable that the length of the overhang portion 37a is equal to or less than the thickness of the base electrode 37. If the projecting length is less than the thickness of the intrinsic base sub-structure 40, the resistance of the base rink sub-structure 39 is too large with respect to the total resistance of the base structure 41. On the other hand, even if the projecting length is greater than the thickness of the base electrode 37, the base rink sub-structure beneath the overhang portion 37a does not widely decrease the total resistance of the base structure 41, and the large base rink sub-structure is wasteful of the real estate.

Figure 4B:
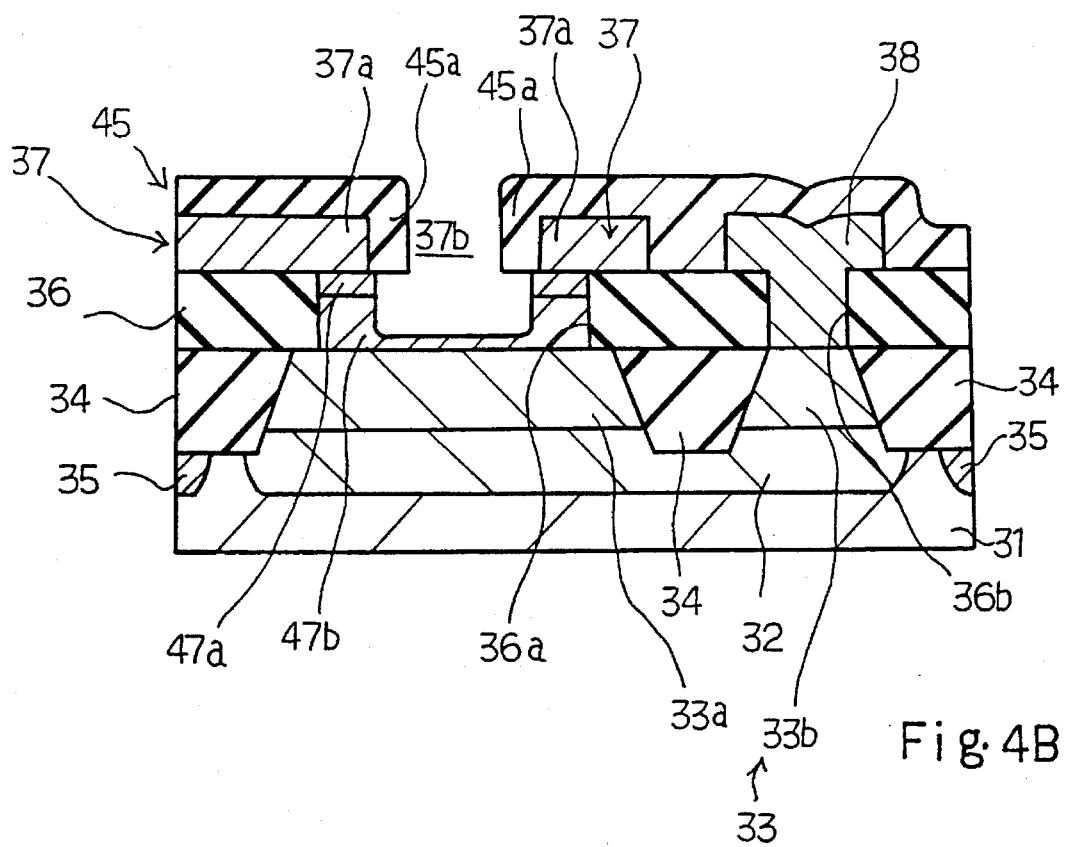

Subsequently, single crystalline silicon and poly-crystalline silicon are grown from the bottom surface of the overhang portion 37a and the surface of the lightly doped n-type epitaxial layer 33 exposed to the base opening 36a by using an ultra high vacuum chemical vapor deposition. As a result, a lightly doped p-type poly-crystalline silicon ring 47a and a lightly doped p-type single crystalline silicon layer 47b are merged with one another as shown in FIG. 4B. The crystal orientation of the lightly doped p-type single crystalline silicon layer 47b is (100) at the bottom surface and (110) at the side surface. The lightly doped p-type single crystalline silicon layer 47b is rather thick under the overhang portion 37a, and an ultra high vacuum chemical vapor deposition achieves the configuration by using reactant gaseous mixture of Si$_2$H$_6$ of 12 sccm and Cl$_2$ of 0.04 sccm and a doping gas of B$_2$H$_6$ of 0.01 sccm in vacuum of the order of $10^{-4}$ torr. Under the conditions of the ultra high vacuum chemical vapor deposition, Cl$_2$ gas suppresses the growth stronger under the opening 37b than under the overhang portion 37a, and the lightly doped p-type single crystalline silicon layer 47b has the peripheral portion thicker than the central portion. In this instance, the lightly doped p-type poly-crystalline silicon ring 47a is 500 angstroms in thickness, and the lightly doped p-type single crystalline silicon layer 47b is 800 angstroms thick under the overhang portion 37a and 300 angstroms thick under the opening 37b. The boron concentration is equal to or less than $3 \times 10^{16}$ cm$^{-3}$, and the side surface of (110) orientation is 500 angstroms in height.

Figure 4C:
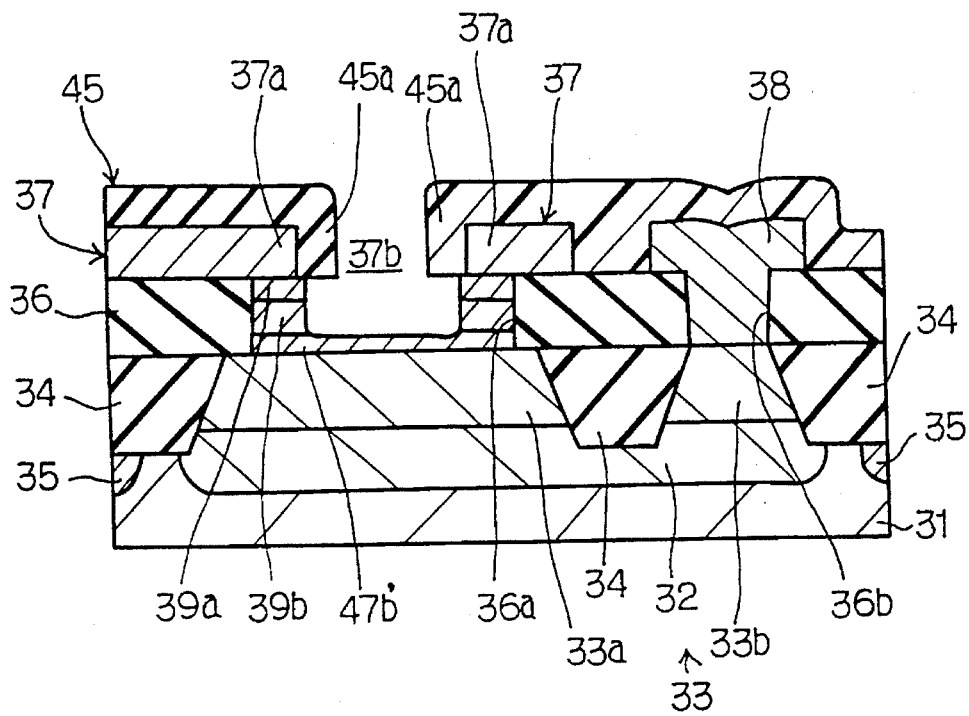

Subsequently, the resultant structure shown in FIG. 4B is placed in a high temperature atmosphere, and the boron atom is diffused from the base electrode 37 through the lightly doped p-type poly-crystalline silicon ring 47a into an upper portion of the lightly doped p-type single crystalline silicon layer 47b. Then, the lightly doped p-type poly-crystalline silicon ring 47a is changed to the heavily doped p-type poly-crystalline silicon ring 39a. On the other hand, the lightly doped p-type single crystalline silicon layer 47b is partially changed into the heavily doped p-type single crystalline silicon ring 39b, and partially remains as the lightly doped p-type single crystalline silicon layer 47' as shown in FIG. 4C. In this instance, the heavily doped p-type single crystalline silicon ring 39b is 500 angstroms thick. Although the boundary between the heavily doped p-type single crystalline silicon ring 39b and the lightly doped p-type single crystalline silicon layer 47b' is not clearly discriminative because of the continuous diffusion, the heavily doped p-type single crystalline silicon ring 39b is defined as a portion higher in boron concentration than the intrinsic base structure.

The thermal diffusion is carried out in an nitrogen atmosphere at 860 degrees in centigrade for 20 minutes. However, the heat treatment may be carried out in the ultra high vacuum chemical vapor deposition reactor. In order to prevent the poly-crystalline/single-crystalline silicon from contaminant in the furnace, the poly-crystalline/single crystalline silicon may be covered with a thin silicon oxide film.

Subsequently, the resultant structure shown in FIG. 4C is dipped into the etchant in which hydrofluoric acid is diluted in pure water fifty times. The etching in the diluted hydrofluoric acid is carried out 1 minute, and the thin silicon oxide is removed from the exposed surface of the poly-crystalline/single crystalline silicon.

Figure 4D:
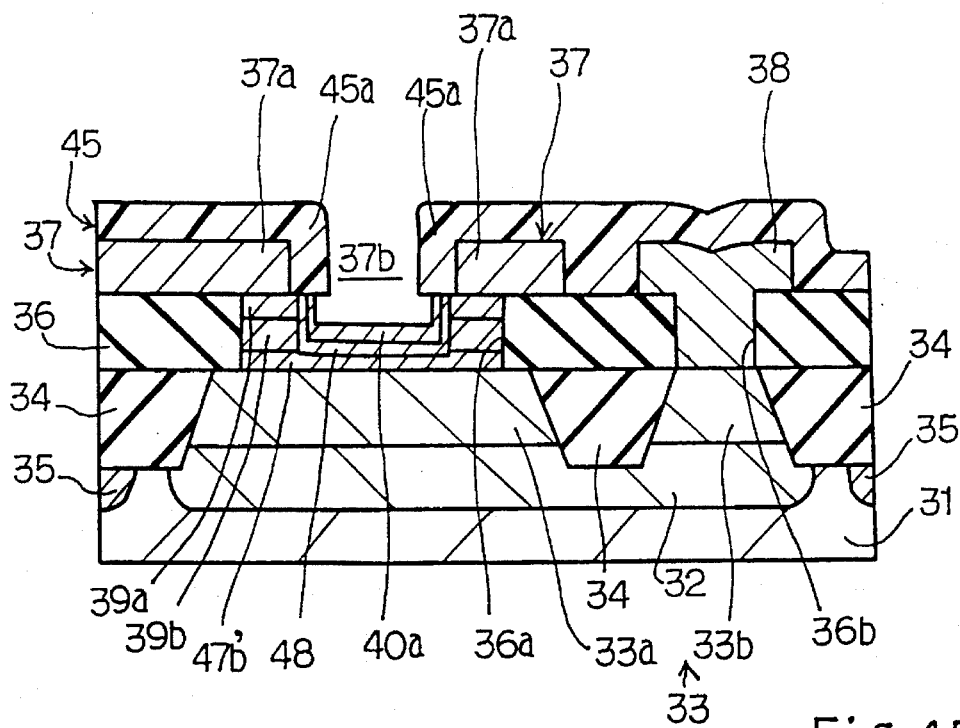

The structure shown in FIG. 4C is placed in the ultra high vacuum chemical vapor deposition reactor again, and silicon oxide is perfectly removed at 850 degrees in centigrade for one minute. On the fresh poly crystalline/single crystalline silicon surfaces is deposited a lightly doped p-type silicon germanium layer 48 which is carried out through an ultra high vacuum chemical vapor deposition using reactant gaseous mixture of $Si_2H_6$ and $GeH_4$ and doping gas of $B_2H_6$. Successively, the doping gas is increased, and the heavily doped p-type silicon germanium layer 40a is deposited over the lightly doped p-type silicon germanium layer 48. The deposited silicon germanium has the composition expressed as $SiO_{0.9}GeO_1$, and the lightly doped p-type silicon germanium layer 48 and the heavily doped p-type silicon germanium layer 40a have respective bottom portions thicker than the respective side wall portions due to the difference in growth speed between the crystal orientations. The resultant structure at this stage is illustrated in FIG. 4D.

Subsequently, a heat treatment is carried out in the nitrogen atmosphere at 900 degrees in centigrade for 15 minutes again. Then, the boron is diffused into the side wall portion of the lightly doped p-type silicon germanium layer 48m and is merged into the heavily doped p-type silicon germanium layer 40a. A silicon oxide layer may cover the heavily doped p-type silicon germanium layer 40a so as to prevent the layer 40a from contaminant in the furnace. The remaining bottom portion of the lightly doped p-type silicon germanium layer 48 serves as the lightly doped p-type silicon germanium layer 40b. This heat treatment may be carried out at a later stage before formation of the emitter region 42.

Figure 4E:
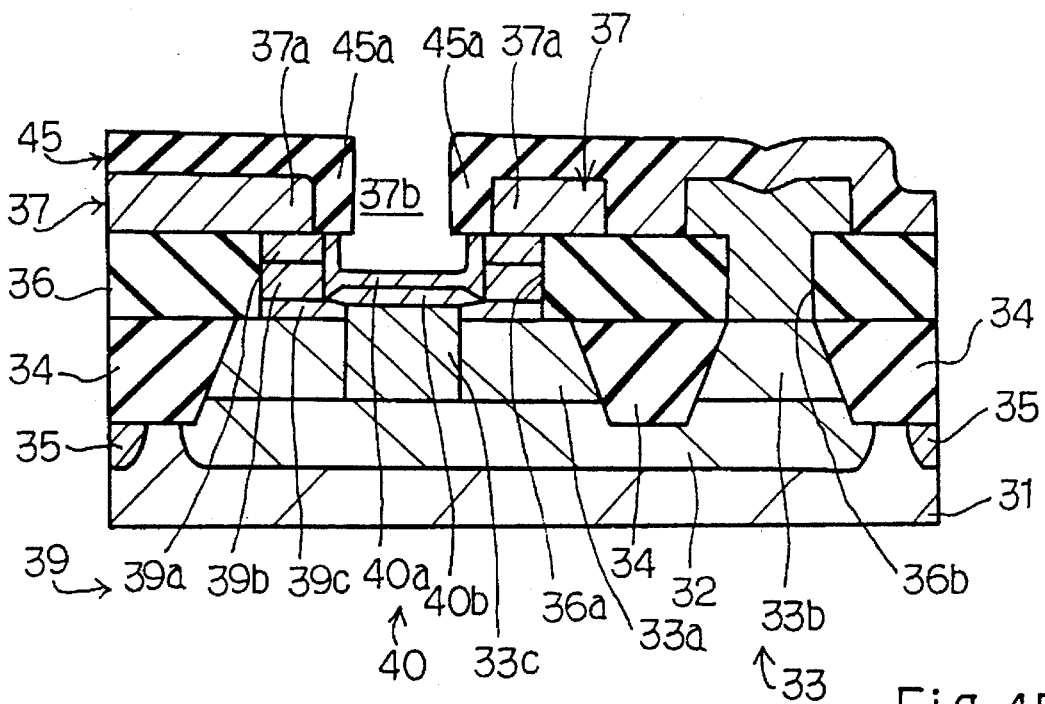

Subsequently, the buried collector region 33c is formed under the intrinsic base sub-structure 40 through the opening 37b by using an ion implantation of phosphorous. The buried collector region 33c has a dopant concentration of the order of $4\times10^{17} cm^{-3}$. The formation of the buried collector region 33c may be carried out after the growth of the lightly doped single crystalline silicon layer 47b. The resultant structure at this stage is illustrated in FIG. 4E.

Subsequently, silicon oxide is deposited over the entire surface of the structure through a low pressure chemical vapor deposition, and the silicon oxide layer is etched back by using an anisotropic plasma-assisted etching technique. The insulating side wall 43 is left on the side wall portion of the heavily doped p-type silicon germanium layer 40a.

Figure 4F:
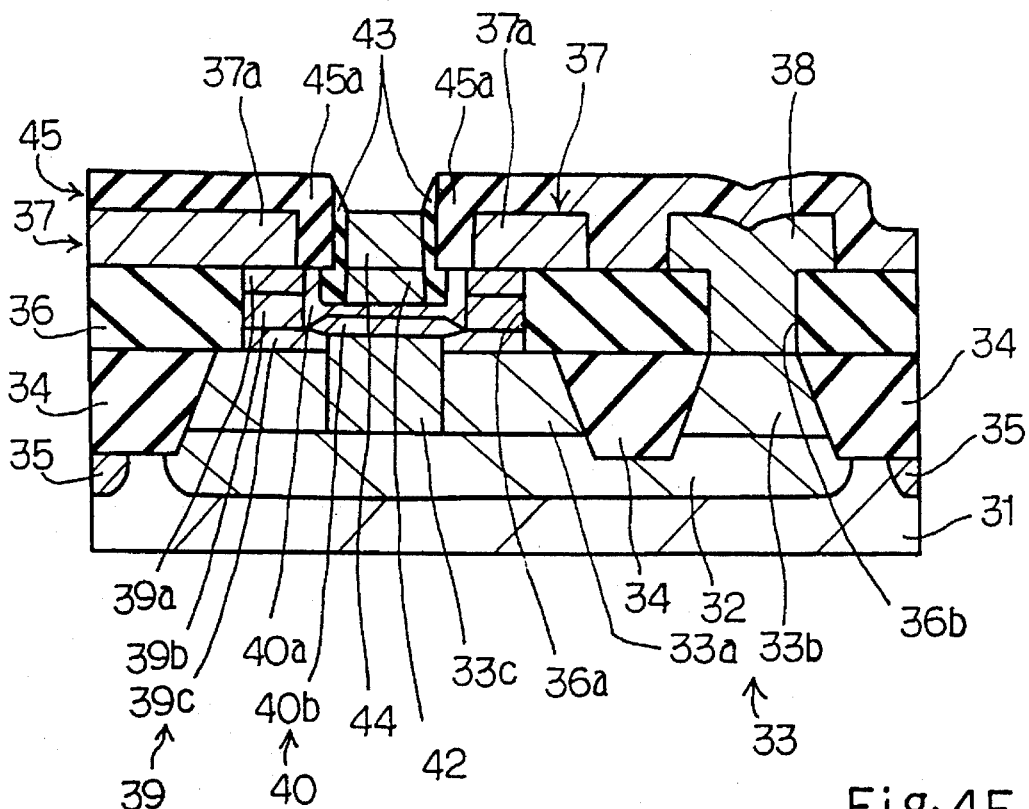

The heavily doped n-type emitter region 42 is grown to thickness of 1000 angstroms on the exposed surface of the heavily doped p-type silicon germanium layer 40a by using the selective growth, and the dopant concentration of the emitter region 42 is of the order of $1\times10^{19} cm^{-3}$. The emitter electrode 44 is formed on the emitter region 42 through a selective poly-crystalline silicon forming technique, and has a dopant concentration of $2\times10^{20} cm^{-3}$. The emitter electrode 44 is 2000 angstroms thick. The resultant structure at this stage is illustrated in FIG. 4F.

Contact holes are formed in the silicon nitride layer 45 by using the lithographic techniques and a dry etching technique. An aluminum alloy is deposited over the entire surface of the structure, and the wirings 46a, 46b and 46c are patterned so as to come into contact with the base electrode 37, the emitter electrode 44 and the collector electrode 38 as shown in FIG. 3.

As will be appreciated from the foregoing description, the process of fabricating the bipolar transistor diffuses the p-type dopant impurity into the lightly doped p-type single crystalline silicon layer 47 before the formation of the intrinsic base sub-structure, and the impurity profile in the intrinsic base sub-structure is stable. Moreover, the buried collector region 33c passes through the lightly doped p-type single crystalline silicon layer 47b', and the intrinsic base sub-structure 40 is electrically connected to the collector without exposing the surface of the n-type epitaxial layer 33. For this reason, the collector layer is free from the crystal damage due to the etching, and undesirable parasitic p-n junctions are never generated. This results in a stable characteristics of the bipolar transistor.

Second Embodiment

Figure 5:
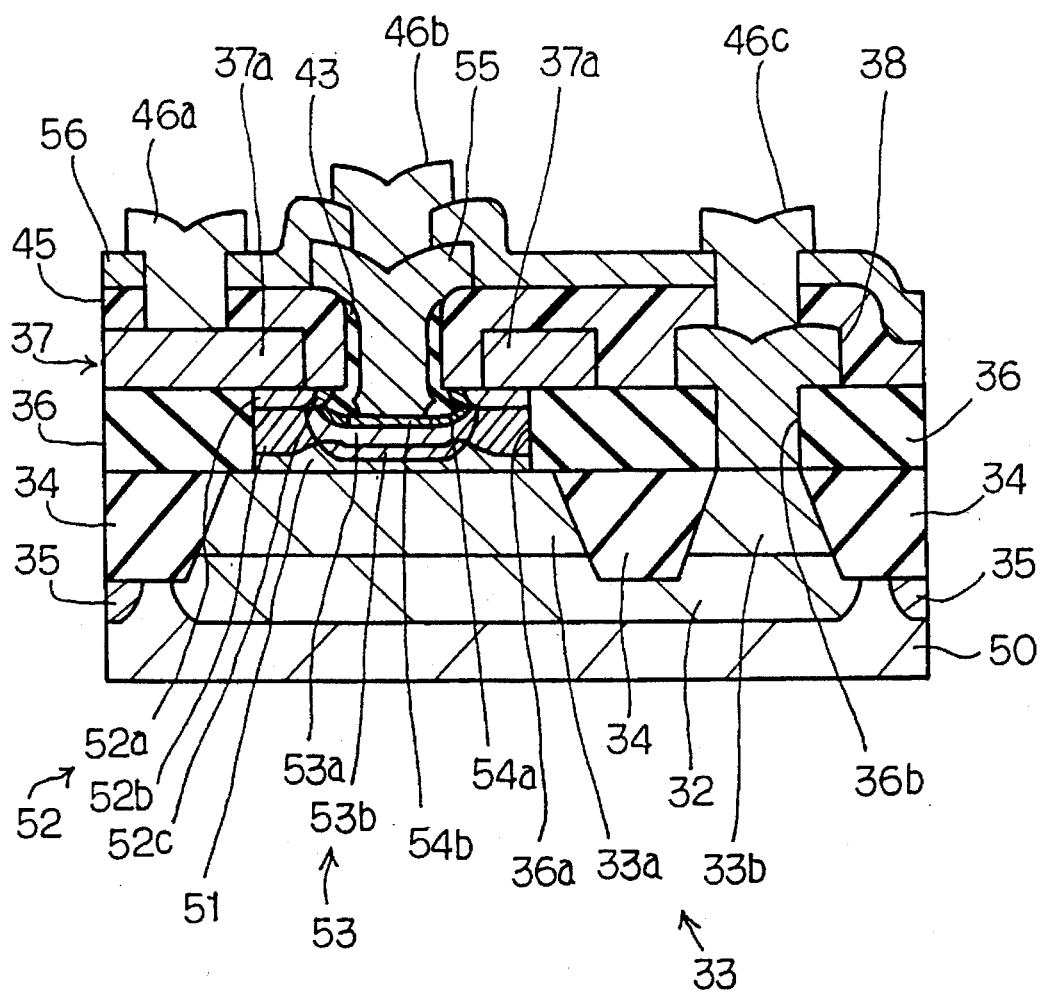
FIG. 5 is a cross sectional view showing the structure of another bipolar transistor according to the present invention.

Turning to FIG. 5 of the drawings, another bipolar transistor embodying the present invention is fabricated on a lightly doped p-type single crystalline silicon substrate 50. Reference signs used for the first embodiment are labeled to corresponding layers and corresponding regions of the bipolar transistor implementing the second embodiment without detailed description for the sake of simplicity.

The bipolar transistor shown in FIG. 5 is different from the bipolar transistor shown in FIG. 3 in the following features.

First, an n-type single crystalline silicon layer 51 is grown on the exposed area of the lightly doped n-type epitaxial layer 33a. For this reason, a base rink sub-structure 52 and an intrinsic base sub-structure 53 are fabricated on the n-type single crystalline silicon layer 51.

Second, the intrinsic base sub-structure has a heavily doped p-type graded base layer 53a of silicon germanium, and the germanium content of the heavily doped p-type graded base layer 53a is changed from 10 per cent on the collector side to zero per cent on the emitter side.

Third, a lightly doped p-type poly-crystalline silicon layer 54a is epitaxially grown on the heavily doped p-type graded base layer 53a, and n-type dopant impurity is diffused from an emitter electrode 55 of doped poly-crystalline silicon into a central portion of the lightly doped p-type poly-crystalline silicon layer 54a so as to form a heavily doped n-type emitter diffusion layer 54b.

Fourth, the emitter electrode 55 is patterned from a poly-crystalline silicon layer deposited over the entire surface of the structure.

Finally, a silicon oxide layer 56 is deposited over the silicon nitride layer 45, and the metal wirings 46a, 46b and 46c are held in contact with the base electrode 37, the emitter electrode 55 and the collector electrode 38 through contact holes formed in the silicon oxide layer 56 and the silicon nitride layer 45.

A process sequence for fabricating the bipolar transistor is hereinbelow described with reference to FIGS. 6A to 6H. The process for the second embodiment is similar to the above described process until the formation of the base opening 36a shown in FIG. 4A. The structure shown in FIG. 6A is corresponding to the structure shown in FIG. 4A, and is scaled up so as to clearly illustrate the base opening 36a.

Figure 6A:
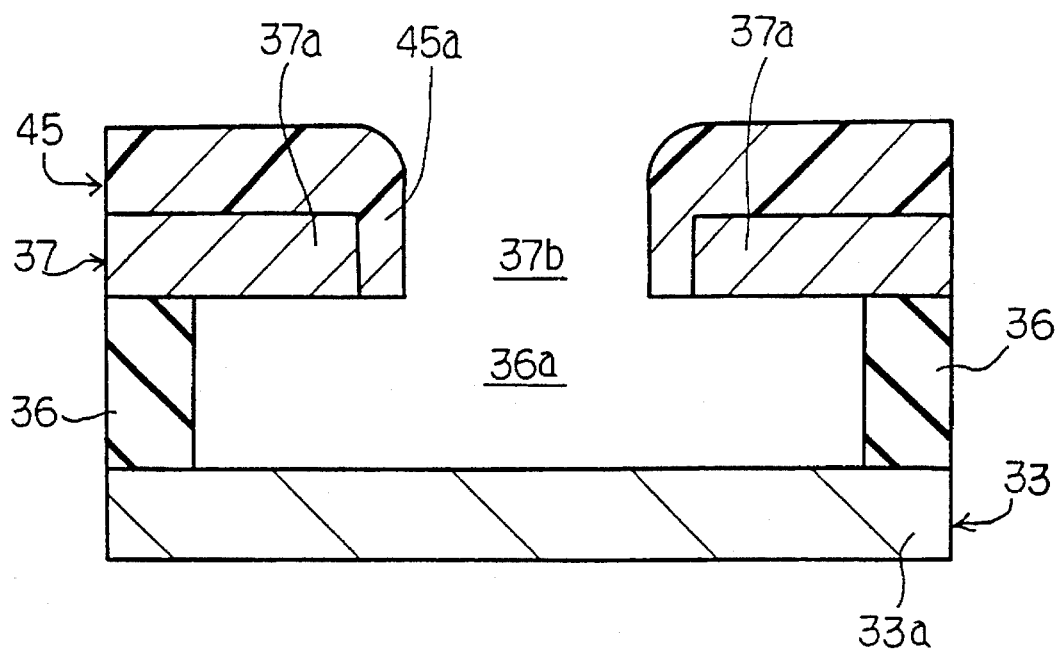
FIGS. 6A to 6H are cross sectional view showing a process sequence for fabricating the bipolar transistor according to the present invention.
Figure 6B:
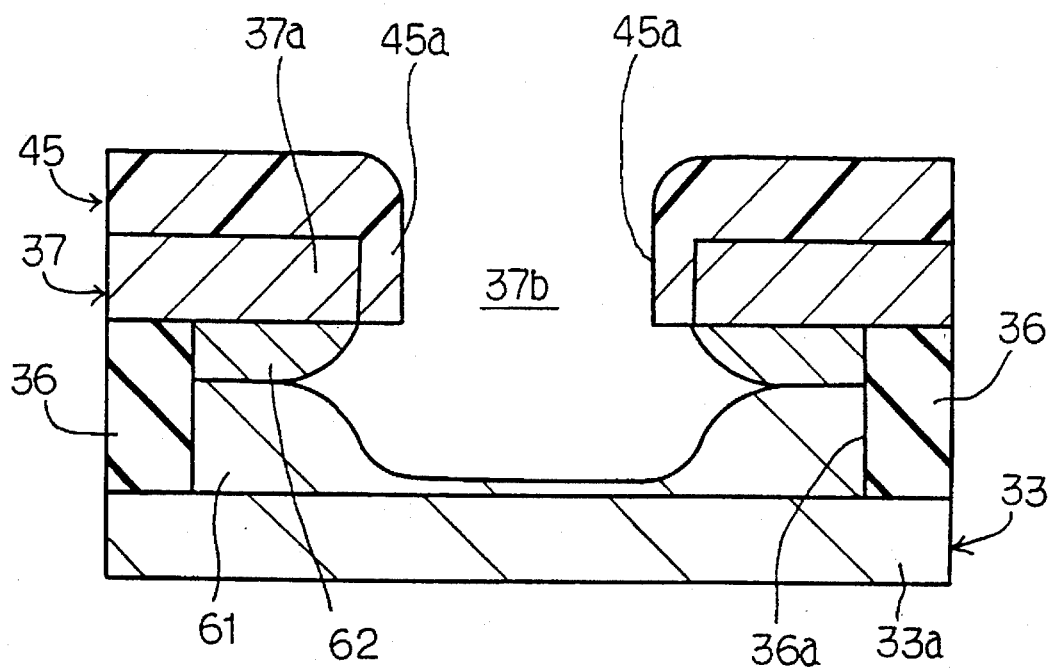

The structure shown in FIG. 6A is placed in the ultra high vacuum chemical vapor deposition reactor (not shown), and gaseous mixture of $Si_2H_6$, $Cl_2$ and $PH_3$ is introduced into the reactor, Then, an n-type single crystalline silicon layer 61 doped at $1 \times 10^{17}$ cm$^{-3}$ is grown on the exposed surface of the lightly doped n-type epitaxial silicon layer 33, and the n-type poly-crystalline silicon layer 62 also doped at $1 \times 10^{17}$ cm$^{-3}$ is grown from the lower surface of the overhang portion 37a. The n-type poly-crystalline silicon layer 62 is merged with the n-type single crystalline silicon layer 61 as shown in FIG. 6B. The n-type poly-crystalline silicon layer 61 has concave configuration due to $Cl_2$ strongly affecting the n-type poly-crystalline silicon layer under the opening 37b.

Though not shown in FIG. 6B, a silicon oxide layer covers exposed surfaces of the n-type poly-crystalline silicon layer 62 and the n-type single crystalline silicon layer 61, and the resultant structure is placed in a high temperature inert gas atmosphere. The silicon oxide layer (not shown) prevents the n-type poly-crystalline silicon layer 62 and the n-type single crystalline silicon layer 61 from contaminant in the high temperature inert gas atmosphere. While the heat is being applied, the boron is diffused from the base electrode 37 into the n-type poly-crystalline silicon layer 62 and the n-type single crystalline silicon layer 61. The n-type poly-crystalline silicon layer 62 is converted to the heavily doped p-type poly-crystalline silicon layer 52a, and an upper portion of the n-type single crystalline silicon layer 61 is also converted to the heavily doped p-type poly-crystalline silicon layer 52b. The remaining lower portion of the n-type poly-crystalline silicon layer 62 serves as the n-type poly-crystalline silicon layer 51.

After the heat treatment, the silicon oxide layer (not shown) is etched away in the hydrofluoric acid containing etchant. The resultant structure at this stage is illustrated in FIG. 6C.

Figure 6C:
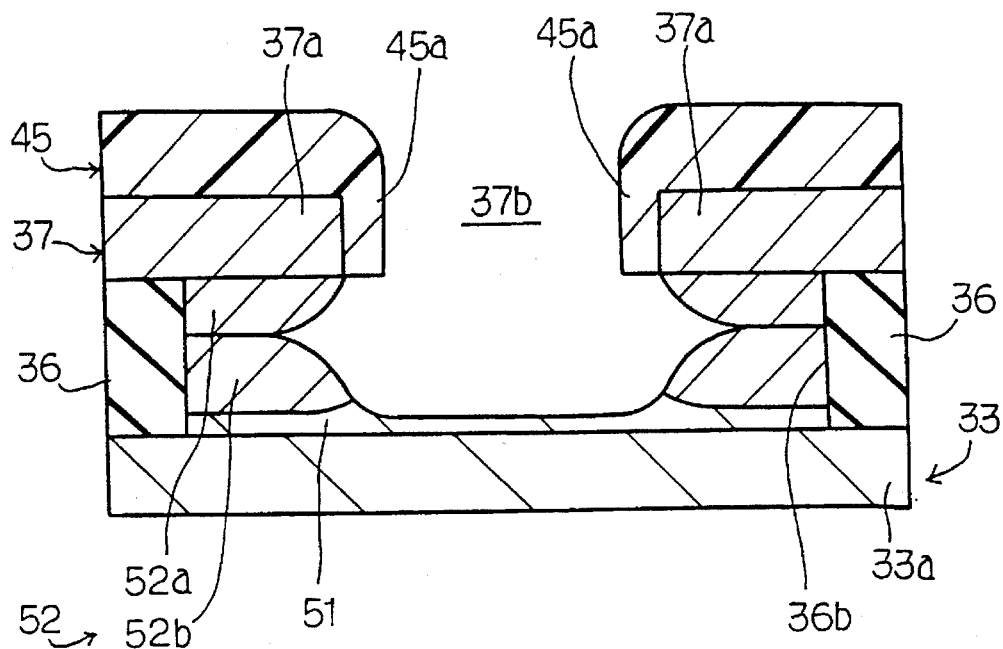
Figure 6D:
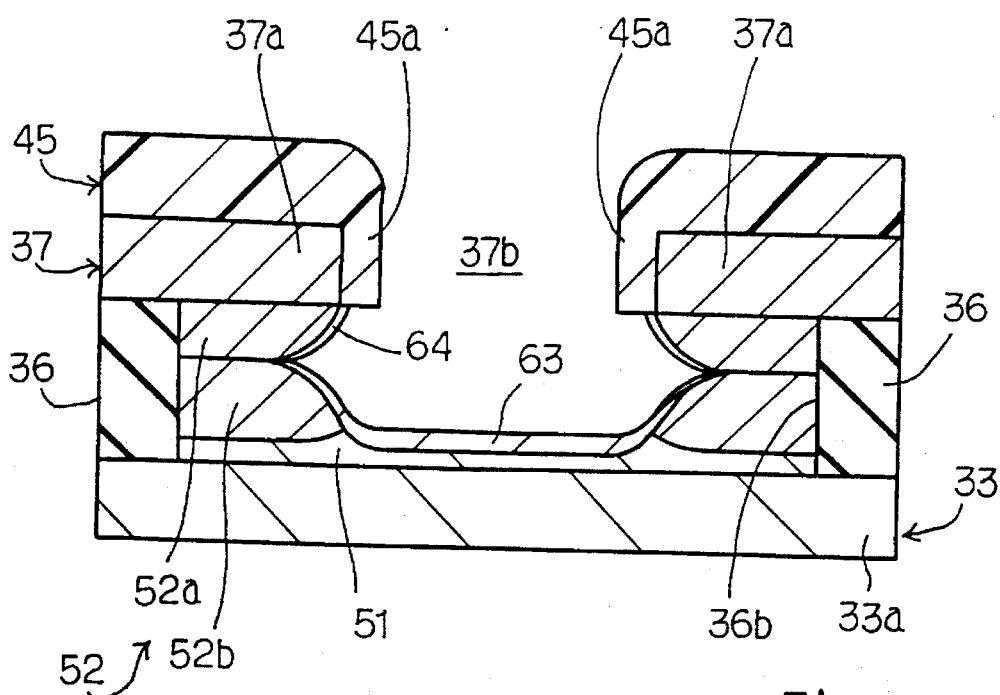

The structure shown in FIG. 6C is placed in the ultra high vacuum chemical vapor deposition reactor (not shown), and a lightly doped p-type silicon germanium layer 63 and a lightly doped p-type poly-crystalline silicon germanium layer 64 are grown on the heavily doped p-type single crystalline silicon layer 52b and the heavily doped p-type poly-crystalline silicon layer 52a, respectively, and the dopant concentration of these layers 63 and 64 are equal to or less than $5 \times 10^{16}$ cm$^{-3}$, and the silicon germanium is has the composition expressed as $Si_{0.9}Ge_{0.1}$. The lightly doped p-type silicon germanium layer 63 is about 200 angstroms thick under the opening 37b and about 80 angstroms thick under the overhang portion 37a.

Figure 6E:
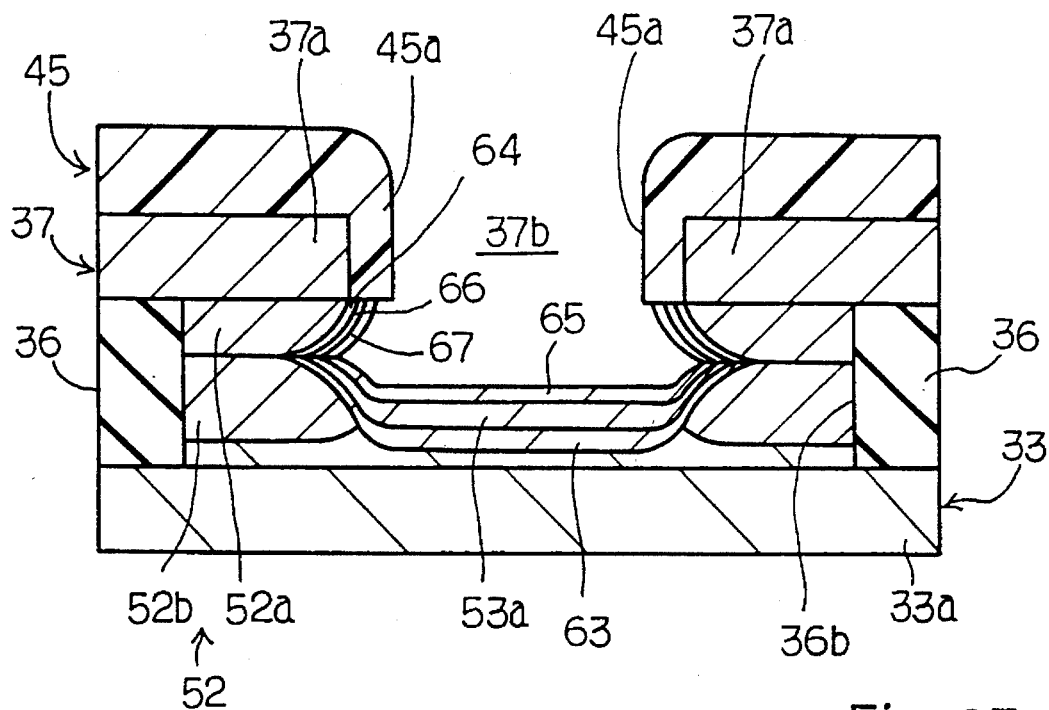

Continuously, the heavily doped p-type graded base layer 53a of silicon-germanium and a lightly doped p-type single crystalline silicon layer 65 are grown on the lightly doped p-type silicon germanium layer 63, and the heavily doped p-type poly-crystalline silicon germanium layer 66 and a lightly doped p-type poly-crystalline silicon layer 67 are concurrently grown on the lightly doped p-type poly-crystalline silicon germanium layer 64 by using the ultra high vacuum chemical vapor deposition as shown in FIG. 6E.

The graded base layer 53a has the germanium component of 10 mol % at an interface with the lighly doped p-type silicon germanium layer 63 and zero per cent at an interface with the lightly doped p-type single crystalline silicon 65, and the germanium component is linearly changed therebetween. The heavily doped p-type graded base layer 53a is doped at $4 \times 10^{18}$ cm$^{-3}$, and is 600 angstroms in thickness. The lightly doped p-type single crystalline silicon layer 65 is doped at $7 \times 10^{17}$ cm$^{-3}$, and is 250 angstroms in thickness. The resultant structure at this stage is illustrated in FIG. 6E.

The layers 65 and 67 are covered with a silicon oxide layer (not shown), and the silicon oxide layer prevents the layers 65 and 67 from contaminant in a furnace. Then, heat is applied to the struture, and the boron is diffused from the heavily doped p-type single crystalline silicon layer 52b into a peripheral portion of the lightly doped p-type silicon germanium layer 63. Similarly, the boron is diffused into the lightly doped poly-crystalline silicon germanium layer 64. As a result, the peripheral portion is coverted to a heavily doped p-type silicon germanium layer 68, and the heavily doped p-type poly-crystalline silicon germanium layer 64 is merged with the heavily doped p-type silicon germanium layer 66 so as to form the hevily doped p-type poly-crystalline silicon germanium layer 52c.

The heavily doped poly-crystalline silicon layer 52a, the heavily doped p-type single crystalline silicon layer 52b and the heavily doped p-type poly-crystalline silicon germanium layer 52c as a whole constitute the base rink sub-structure 52.

The remaining portion of the lightly doped p-type silicon germanium layer 63 serves as a part 53b of the intrinsic base sub-structure 53. In other words, the lightly doped p-type silicon germanium layer 53b and the graded base layer 53a form in combination the intrinsic base sub-structure 53.

Figure 6F:
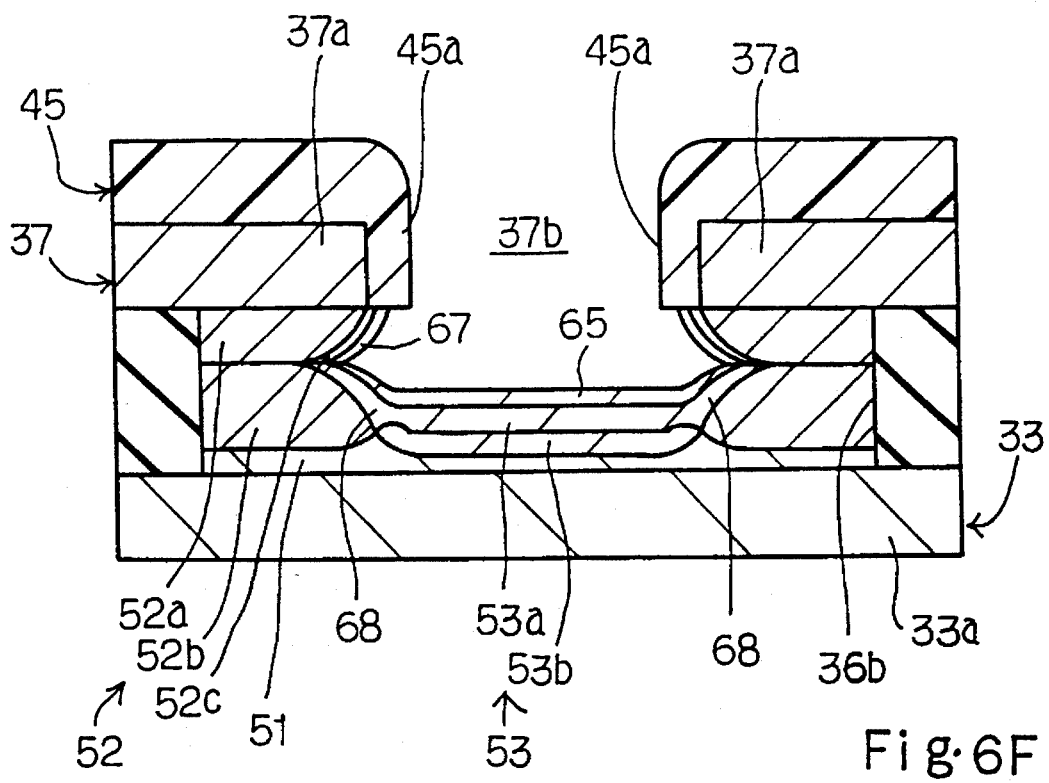

The silicon oxide layer (not shown) is etched away in the hydrofluoric acid containing etchant, and the resultant structure at this stage is illustrated in FIG. 6F.

Subsequently, silicon oxide is deposited over the entire surface of the structure through a low pressure chemical vapor deposition, and the silicon oxide layer is etched back by using an anisotropical plasma-assisted etching technique. Then, the insulating side wall 43 is left on the lightly doped p-type polysilicon layer 67 and a peripheral area of the lightly doped p-type single crytal silicon layer 65.

Figure 6G:
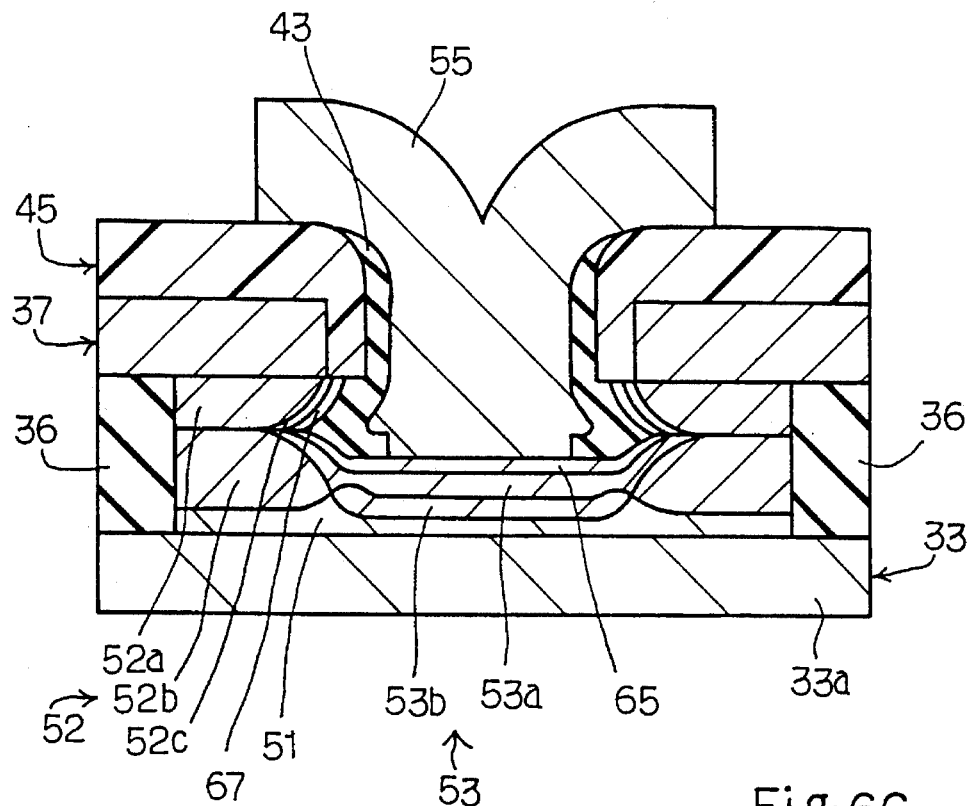

Subsequently, polysilicon is deposited over the entire sruface of the structure through the low pressure chemical vapor deposition, and n-type dopant impurity such as arsenic is doped into the polysilicon layer. The n-type dopant impurity may be introduced into the polysilicon layer through the ion implantation. The doped polysilicon layer is patterned into the emitter electrode 55, and the resultant structure at this stage is illustrated in FIG. 6G.

The n-type dopant impurity is diffused from the emitter electrode 55 into the lightly doped p-type single crystalline silicon layer 65 by using a rapid thermal annealing technique, and the rapid thermal annealing is carried out at 950 degrees in centigrade for 10 seconds.

Figure 6H:
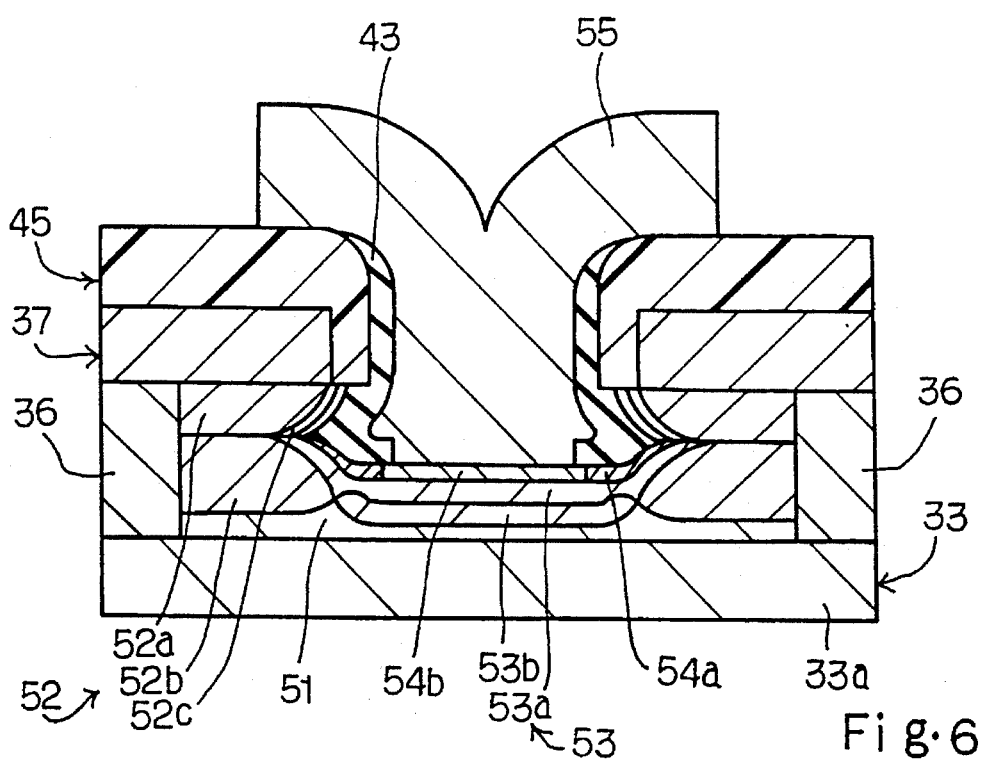

Then, the lightly doped p-type single crystalline silicon layer 65 is partially converted into the heavily doped n-type emitter region 54b, and the lightly doped p-type single crystalline silicon layer 54a surrounds the heavily doped n-type emitter region 54b. The resultant structure is illustrated in FIG. 6H.

The silicon oxide layer 56 is deposited over the entire surface of the structure by using the chemical vapor deposition, and contact holes are formed in the silicon oxide layer 56 and the silicon nitride layer 45. Aluminum or aluminum alloy is deposited over the entire surface of the silicon oxide layer 56, and the aluminum layer or the aluminum alloy layer is patterned into the metal wirings 46a, 46b and 46c.

The buried collector region 33c is not incorporated in the bipolar transistor implementing the second embodiment, and the process sequence is simpler than that of the first embodiment. Moreover, the contact area between the base and the collector is decreased, and, accordingly, the junction capacitance at the base-and-collector is expected to be reduced.

Figure 7:
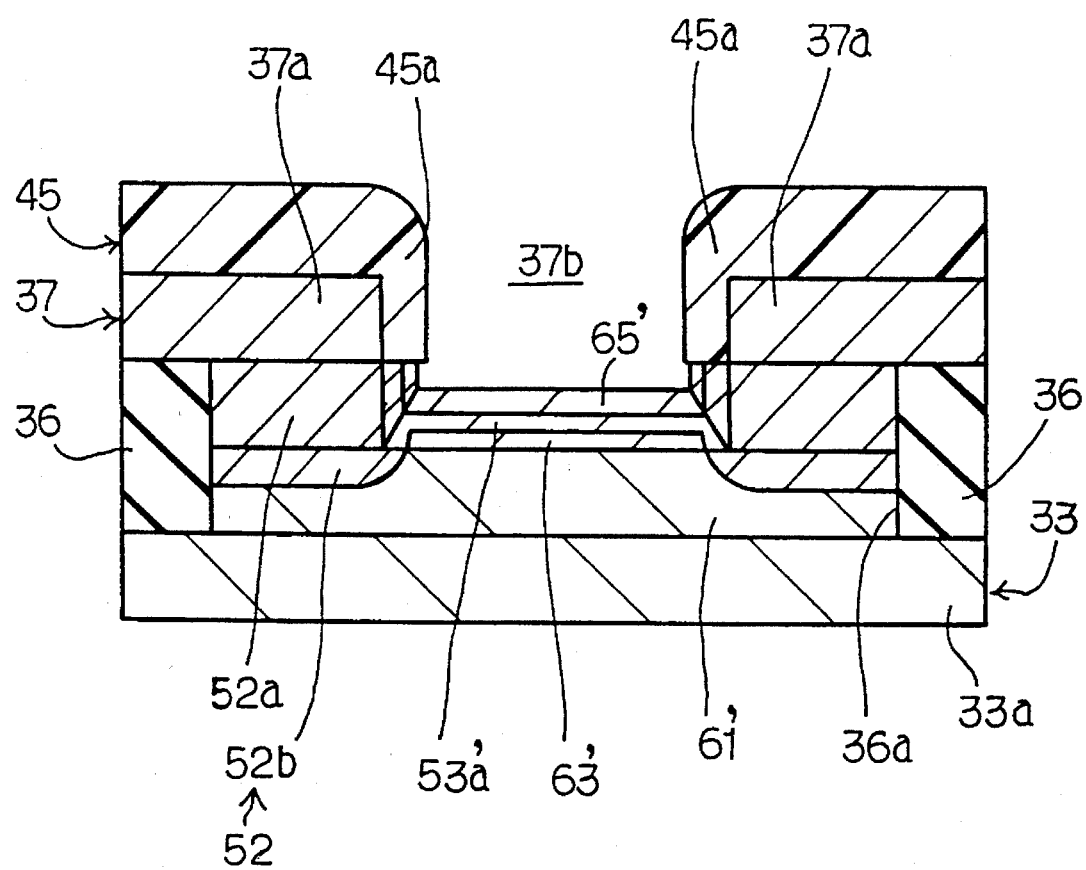
FIG. 7 is a cross sectional view showing the structure of a modification of the bipolar transistor shown in FIG. 5.

The epitaxial growth in the base opening 36a may be carried out through a molecular beam epitaxy using a source gas of $Si_2H_6$ as similar to the process disclosed in Japanese Patent Publication of Unexamined Application No. 4-330730. Then, a flat n-type single crystalline silicon layer 61' is grown from the exposed surface of the lightly doped n-type epitaxial silicon layer 33, and a lightly doped p-type silicon germanium layer 63', a graded base layer 53a' of silicon germanium and a lightly doped p-type single crystalline silicon layer 65' are laminated on the flat n-type single crystalline silicon layer 61' as shown in FIG. 7.

Although particular embodiments of the present invention have been shown and described, it will be obvious to those skilled in the art that various changes and modifications may be made without departing from the spirit and scope of the present invention. For example, the n-type dopant impurity and the p-type dopant impurity may be exchanged to each other so as to form a p-n-p type bipolar transistor, and the semiconductor materials do not set a limit on the technical scope of the present invention. The intrinsic base structure may be formed of silicon.

The silicon nitride and the silicon oxide is exchangeable in the process described hereinbefore. In this case, a thin silicon oxide layer is provided between the epitaxial layer 33 and a silicon nitride layer deposited over the epitaxial layer 33.

What is claimed is:

1. A process of fabricating a bipolar transistor, comprising the steps a) preparing a base structure having a first semiconductor layer of a first conductivity type and a first insulating layer of a first insulating material covering said first semiconductor layer;

b) depositing a second semiconductor layer of a second conductivity type opposite to said first conductivity type on said first insulating layer;

c) forming a first opening in said second semiconductor layer exposing a part of said first insulating layer;

d) covering an upper surface of said second semiconductor layer and an inner wall of said second semiconductor layer defining said first opening with a second insulating layer of a second insulting material;

e) etching said first insulating layer by using an etchant having a selectivity between said first insulating material and said second insulating material so as to form a second opening exposing a part of said first semiconductor layer, said second opening being wider than said first opening so that said second semiconductor layer has an overhang portion exposing a lower surface thereof to said second opening;

f) epitaxially growing a third semiconductor layer from said lower surface of said second semicondcutor layer and said part of said first semiconductor layer until a space below said overhang portion is filled with a peripheral portion of said third semiconductor layer, said peripheral portion of said third semiconductor layer being thicker than a central portion of said third semiconductor layer below said first opening;

g) diffusing a dopant impurity of said second conductivity type from said second semiconductor layer into said peripheral portion so as to form a base rink substructure;

h) growing a fourth semiconductor layer of said second conductivity type from said third semiconductor layer so as to form an intrinsic base structure; and i) forming an emitter region of said first conductivity type on said fourth semiconductor layer.

2. The process as set forth in claim 1, in which said first semiconductor layer and said second semiconductor layer are formed of single crystalline silicon and poly crystalline silicon, respectively, and said third semiconductor layer includes a single crystalline silicon sub-layer grown from said lower surface of said second semiconductor layer and a poly-crystalline silicon sub-layer grown from said part of said first semicondcutor layer and having a peripheral portion merged with said single crystalline silicon sub-layer.

3. The process as set forth in claim 2, in which said single crystalline silicon sub-layer and said poly-crystalline silicon sub-layer are concurrently grown by an ultra high vacuum chemical vapor deposition.

4. The process as set forth in claim 3, in which said ultra high vacuum mechanical vapor deposition is carried out by using a reactant gaseous mixture of $Si_2H_6$ and $Cl_2$ and a dopant gas mixed with said reactant gaseous mixture.

5. The process as set forth in claim 4, in which said reactant gaseous mixture contains $Si_2H_6$ of 12 sccm and $Cl_2$ of 0.04 sccm.

6. The process as set forth in claim 1, in which said first semiconductor layer and said second semiconductor layer are formed of single crystalline silicon and poly-crystalline silicon, respectively, said third semiconductor layer including a single crystalline silicon sub-layer grown from said lower surface of said second semiconductor layer and a poly-crystalline silicon sub-layer grown from said part of said first semicondcutor layer and having a peripheral portion merged with said single crystalline silicon sub-layer, said fourth semiconductor layer including a lightly doped silicon-germanium layer covering an exposed surface of said single crystalline silicon sub-layer and a heavily doped silicon-germanium layer covering said lightly doped silicon-germanium layer, another exposed surface of said single crystalline silicon sub-layer and an exposed surface of said poly-crystalline silicon layer.

7. The process as set forth in claim 6, in which said lightly doped silicon-germanium layer and said heavily doped silicon-germanium layer are successively grown by an ultra high vacuum chemical vapor deposition using a reactant gaseous mixture of $Si_2H_6$ and $GeH_4$ and a dopant gas changed in flow rate between a deposition of said lightly doped silicon-germanium layer and a deposition of said heavily doped silicon-germanium layer.

8. The process as set forth in claim 1, further comprising the step of h-1) forming a buried collector region of said first conductivity type passing through a part of said heavily doped silicon-germanium layer into said first semiconductor layer between said step h) and said step i).

9. The process as set forth in claim 8, further comprising the step of h-2) forming an insulating side wall on a side wall portion of said fourth semiconductor layer so as to define a third opening between said step h-1) and said step i), said emitter region being formed in said third opening and held in contact with a bottom portion of said fourth semiconductor layer exposed to said third opening.

10. The process as set forth in claim 1, in which said third semiconductor layer includes a single crystalline semiconductor sub-layer of said first conductivity type grown from said part of said first semiconductor layer and a poly-crystalline semiconductor sub-layer of said first conductivity type grown from said lower surface of said second semiconductor layer, said dopant impurity of said second conductivity type being diffused into said poly-crystalline semiconductor sub-layer and an upper portion of said single crystalline semiconductor sub-layer in said step g), said poly-crystalline semiconductor sub-layer and said upper portion of said single crystalline semiconductor sub-layer forming in combination said base rink structure on a peripheral area of a lower portion of said single crystalline semiconductor sub-layer of said first conductivity type.

11. The process as set forth in claim 10, in which said fourth semiconductor layer includes a single crystalline lower sub-layer of said second conductivity type grown on a central area of said lower portion of said single crystalline semiconductor sub-layer of said first conductivity type and an inner side surface of said upper portion of said single crystalline semiconductor sub-layer of said second conductivity type and a single crystalline graded upper sub-layer of said second conductivity type grown on said single crystalline lower sub-layer of said second conductivity type.

12. The process as set forth in claim 11, in which said single crystalline lower sub-layer of said second conductivity type and said single crystalline graded upper sub-layer are formed of a silicon germanium.

13. The process as set forth in claim 12, in which a germanium content of said single crystalline graded upper sub-layer is varied in a direction of a thickness thereof.

14. The process as set forth in claim 1, in which said step i) includes the sub-steps of i-1) growing a fifth semiconductor layer on said fourth semiconductor layer, i-2) forming an insulating side wall covering at least said base rink structure and defining a third opening, i-3) forming an emitter electrode in said third opening and held in contact with said fifth semiconductor layer, said emitter electrode containing a dopant impurity of said first conductivity type, and i-4) diffusing said dopant impurity of said first conductivity type from said emitter electrode into a part of said fifth semiconductor layer so as to form said emitter region.

* * * * *